United States Patent
Kim et al.

(10) Patent No.: US 11,764,128 B2
(45) Date of Patent: Sep. 19, 2023

(54) SEMICONDUCTOR CHIP INCLUDING THROUGH ELECTRODE, AND SEMICONDUCTOR PACKAGE INCLUDING THE SAME

(71) Applicant: SK hynix Inc., Icheon-si (KR)

(72) Inventors: Seung Hwan Kim, Icheon-si (KR); Hyun Chul Seo, Icheon-si (KR); Hyeong Seok Choi, Icheon-si (KR); Moon Un Hyun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 5 days.

(21) Appl. No.: 17/322,557

(22) Filed: May 17, 2021

(65) Prior Publication Data

US 2022/0208648 A1 Jun. 30, 2022

(30) Foreign Application Priority Data

Dec. 30, 2020 (KR) .................. 10-2020-0186901

(51) Int. Cl.
*H01L 23/48* (2006.01)
*H01L 23/498* (2006.01)
(Continued)

(52) U.S. Cl.
CPC ...... *H01L 23/481* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 24/08* (2013.01); *H01L 24/16* (2013.01); *H01L 24/73* (2013.01); *H01L 25/0657* (2013.01); *H01L 2224/08146* (2013.01);
(Continued)

(58) Field of Classification Search
CPC . H01L 2224/16146; H01L 2224/80146; H01L 2224/16148; H01L 23/481; H01L 23/49816; H01L 23/49822; H01L 23/49838; H01L 23/5383; H01L 23/5386; H01L 24/08; H01L 24/16; H01L 24/73; H01L 25/0657; H10B 80/00
See application file for complete search history.

(56) References Cited

U.S. PATENT DOCUMENTS 8,816,478 B2 * 8/2014 Kanegae ............... H01L 24/11
257/E21.597

FOREIGN PATENT DOCUMENTS

JP          2011071379 A  *  4/2011  ......... H01L 2224/13
KR    1020190087897 A     7/2019

* cited by examiner

*Primary Examiner* — Jasmine J Clark
(74) *Attorney, Agent, or Firm* — WILLIAM PARK & ASSOCIATES LTD.

(57) ABSTRACT

A semiconductor chip includes a body part having a front surface and a rear surface, a plurality of through electrodes penetrating the body part and arranged in a first direction in an array region, a plurality of front surface connection electrodes respectively coupled to the through electrodes over the front surface of the body part, and a plurality of rear surface connection electrodes respectively coupled to the through electrodes over the rear surface of the body part. The array region includes a central region and edge regions positioned on both sides of the central region in the first direction. A center of the front surface connection electrode and a center of the rear surface connection electrode that are positioned in each of the edge regions are positioned at a distance farther from the central region than a center of the corresponding through electrode.

20 Claims, 10 Drawing Sheets

(51) Int. Cl.
*H01L 23/538* (2006.01)
*H01L 23/00* (2006.01)
*H01L 25/065* (2023.01)

(52) U.S. Cl.
CPC ............... *H01L 2224/16146* (2013.01); *H01L 2224/16148* (2013.01); *H01L 2224/16225* (2013.01); *H01L 2224/73204* (2013.01); *H01L 2225/06513* (2013.01); *H01L 2225/06517* (2013.01); *H01L 2225/06544* (2013.01); *H01L 2924/1431* (2013.01); *H01L 2924/1434* (2013.01); *H01L 2924/14335* (2013.01)

SEMICONDUCTOR CHIP INCLUDING THROUGH ELECTRODE, AND SEMICONDUCTOR PACKAGE INCLUDING THE SAME

CROSS-REFERENCE TO RELATED APPLICATIONS

The present application claims priority to Korean Patent Application No. 10-2020-0186901, filed on Dec. 30, 2020, which is incorporated herein by reference in its entirety.

BACKGROUND

1. Field

Various embodiments of the present disclosure relate to a semiconductor technology, and more particularly, to a semiconductor chip including a through electrode, and a semiconductor package including the semiconductor chip.

2. Description of the Related Art

Electronic products are becoming smaller with increasing data processing capacity. This requires semiconductor chips used in electronic products to be thinner and smaller in overall size. Furthermore, semiconductor packages are being fabricated with a plurality of embedded semiconductor chips.

Semiconductor chips may be coupled to each other within a package by a through via that penetrates the semiconductor chips to provide an electrical connection path.

SUMMARY

Some embodiments of the present disclosure are directed to semiconductor chips including a through electrode which may be reduced in size while reducing processing defects, and semiconductor packages including the semiconductor chips.

In accordance with an embodiment of the present disclosure, a semiconductor chip includes: a body part having a front surface and a rear surface; a plurality of through electrodes penetrating the body part and arranged in a first direction in an array region; a plurality of front surface connection electrodes respectively coupled to the through electrodes over the front surface of the body part; and a plurality of rear surface connection electrodes respectively coupled to the through electrodes over the rear surface of the body part. The array region includes a central region and edge regions positioned on both sides of the central region in the first direction. A center of the front surface connection electrode and a center of the rear surface connection electrode that are positioned in each of the edge regions are positioned at a distance farther from the central region than a center of the corresponding through electrode.

In accordance with another embodiment of the present disclosure, a semiconductor chip includes: a body part having a front surface and a rear surface; a plurality of through electrodes penetrating the body part and arranged in a first direction in each of a first array region and a second array region that are adjacent to each other in the first direction; a plurality of front surface connection electrodes respectively coupled to the through electrodes over the front surface of the body part; and a plurality of rear surface connection electrodes respectively coupled to the through electrodes over the rear surface of the body part. Each of the first array region and the second array region includes a central region with a one-side edge region and an other-side edge region respectively positioned on both sides of the central region in the first direction. In each of the first array region and the second array region, a center of the front surface connection electrode and a center of the rear surface connection electrode respectively positioned in the one-side edge region and the other-side edge region are positioned at a distance farther from the central region than a center of the corresponding through electrode.

In accordance with yet another embodiment of the present disclosure, a semiconductor package includes: a first semiconductor chip including a first body part having a front surface and a rear surface, a plurality of first through electrodes penetrating through the first body part and arranged in a first direction, and a plurality of first rear surface connection electrodes respectively coupled to the first through electrodes over the rear surface of the first body part; and a second semiconductor chip including a second body part having a front surface and a rear surface, and a plurality of second front surface connection electrodes that are positioned over the front surface of the second body part. The first rear surface connection electrodes and the second front surface connection electrodes are respectively coupled to each other. The array region includes a central region and edge regions positioned on both sides of the central region in the first direction. A center of the second front surface connection electrode and a center of the first rear surface connection electrode positioned in each of the edge regions are positioned at a distance farther from the central region than a center of the corresponding first through electrode.

DETAILED DESCRIPTION

Figure 1A:
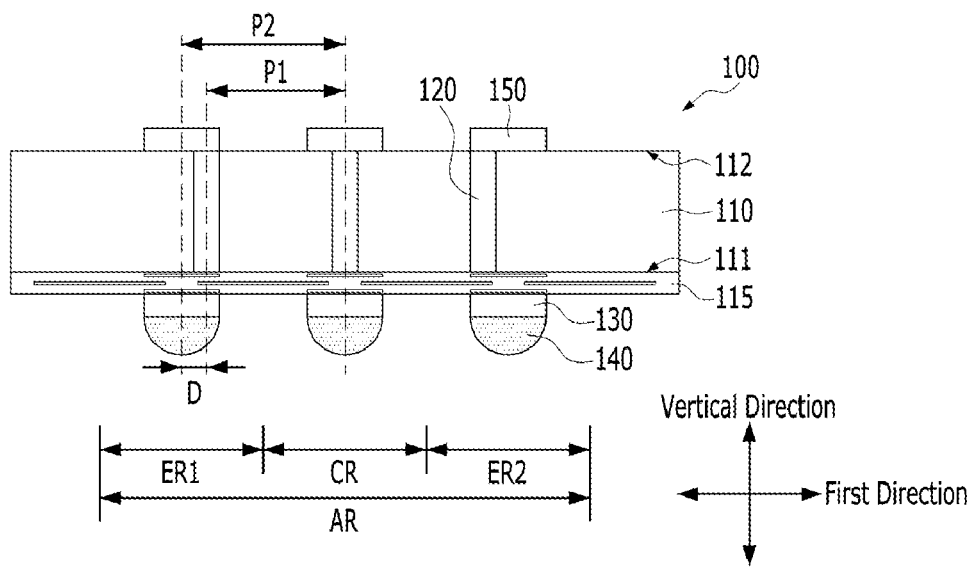
FIG. 1A is a cross-sectional view illustrating a semiconductor chip in accordance with an embodiment of the present disclosure.

Some embodiments of the present disclosure are described below in more detail with reference to the accompanying drawings. The present disclosure may, however, be embodied in different forms and should not be construed as being limited to the embodiments set forth herein. Rather, these embodiments are provided so that this disclosure will be enabling to those skilled in the art. Throughout the disclosure, like reference numerals refer to like parts throughout the various figures and embodiments of the present disclosure.

The drawings are not necessarily to scale, and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, the various embodiments of the present disclosure are described in detail with reference to the attached drawings.

Figure 1B:
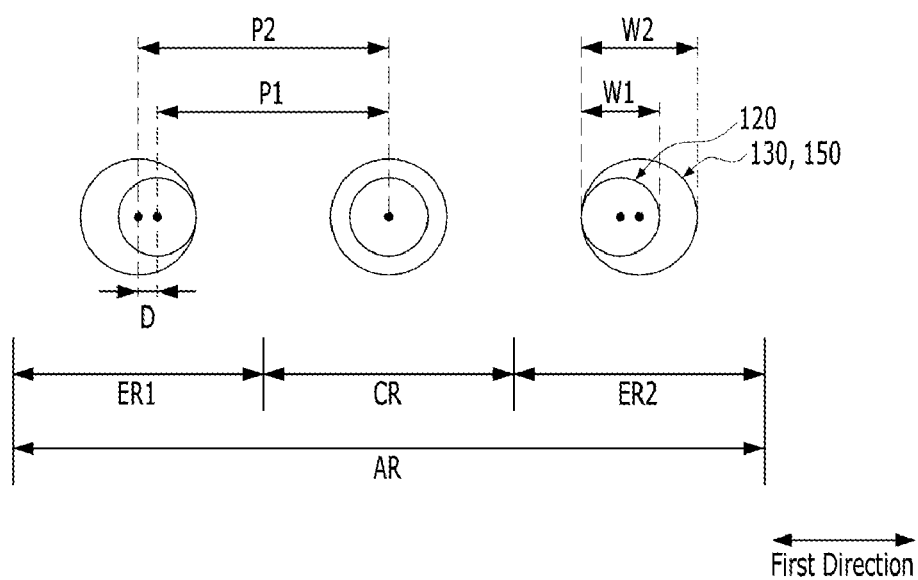
FIG. 1B is a plan view illustrating a region in which through electrodes of FIG. 1A are arranged.

FIG. 1A is a cross-sectional view illustrating a semiconductor chip in accordance with an embodiment of the present disclosure. FIG. 1B is a plan view illustrating a region in which the through electrodes of FIG. 1A are arranged.

Referring to FIGS. 1A and 1B, a semiconductor chip 100 of the present embodiment may include a body part 110, a wiring part 115, a through electrode 120, a front surface connection electrode 130, a bonding layer 140, and a rear surface connection electrode 150.

The body part 110 may be formed of a semiconductor material, such as silicon (Si) or germanium (Ge), and may have a front surface 111, a rear surface 112, and side surfaces coupling the front surface 111 and the rear surface 112 to each other. The front surface 111 of the body part 110 may mean an active surface on which the wiring part 115 electrically connected to the through electrode 120 is disposed, and the rear surface 112 of the body part 110 may mean a surface on the opposite of the front surface 111. In this embodiment of the present disclosure, it is illustrated that the front surface 111 is positioned below the rear surface 112 in the vertical direction. However, the present disclosure is not limited thereto, and the positions of the front surface 111 and the rear surface 112 may be switched.

The wiring part 115 may include diverse circuits/wiring structures. For the sake of convenience in description, the circuits/wiring structures in the wiring part 115 are briefly illustrated as lines, but the shape and connection relationship of the circuits/wiring structures may be diversely modified. Here, the circuits/wiring structures may be diversely realized according to the type of the semiconductor chip 100. For example, the semiconductor chip 100 may include volatile memory, such as a Dynamic Random Access Memory (DRAM) and Static RAM (SRAM), non-volatile memory, such as NAND flash, Resistive RAM (RRAM), Phase-change RAM (PRAM), Magneto-resistive RAM (MRAM) and ferroelectric RAM (FRAM), a logic circuit and the like.

The through electrode 120 may be formed in the body part 110. The through electrode 120 may have a column shape extending in a vertical direction from the front surface 111 of the body part 110 to the rear surface 112 to penetrate the body part 110. As an example, the through electrode 120 may be a Through Silicon Via (TSV). The through electrode 120 may include diverse conductive materials. As an example, the through electrode 120 may include a metal, such as copper (Cu), tin (Sn), silver (Ag), tungsten (W), nickel (Ni), ruthenium (Ru), and cobalt (Co), or a compound of the metal. Although not illustrated, a dielectric liner for insulating the through electrode 120 and the body part 110 from each other may be interposed between the through electrode 120 and the body part 110. Also, although not illustrated, a barrier metal layer for preventing diffusion of the metal forming the through electrode 120 may be formed to surround the sidewall of the through electrode 120. One end of the through electrode 120 may be coupled to the wiring part 115, and the other end of the through electrode 120 may be coupled to the rear surface connection electrode 150. One end of the through electrode 120 may be electrically connected to the front surface connection electrode 130 through the wiring part 115. Diverse signals or power used for driving the semiconductor chip 100 may be transferred through the through electrode 120.

The through electrodes 120 may be arranged to have a first pitch P1 in a first direction. Here, the first pitch P1 may mean a distance between the center of one through electrode 120 and the center of a neighboring through electrode 120. The first pitch P1 may have a substantially constant value, that is, a fixed value. Also, each through electrode 120 may have a first width W1 in the first direction. The first width W1 may have a substantially constant value, that is, a fixed value. Although each through-electrode 120 is illustrated to have a circular shape in terms of a plan view, the planar shape of each through electrode 120 may be diversely modified.

A region in which the through electrodes 120 are arranged may be referred to as an array region AR. Here, the array region AR may include a central region CR positioned at the center, and edge regions ER1 and ER2 positioned on both sides of the central region CR in the first direction. For the sake of convenience in description, the edge region which is positioned on one side in the first direction, e.g., the left side, may be referred to as a one-side edge region ER1, and the edge region which is positioned on the other side in the first direction, e.g., the right side, may be referred to as an other-side edge region ER2. In the present embodiment, it is illustrated that three through electrodes 120 are arranged in the first direction in the array region AR and the three through electrodes 120 are respectively positioned on the one-side edge region ER1, the central region CR, and the other-side edge region ER2. However, the embodiment of the present disclosure is not limited thereto, and the number of the through electrodes 120 arranged in the first direction in the array region AR may be diversely changed, and the number of the regions that are distinguished according to the arrangement of the through electrodes 120 in the array region AR may also be diversely changed.

The front surface connection electrode 130 may be formed over the wiring part 115 which is formed over the front surface 111 of the body part 110. The front surface connection electrode 130 may be electrically connected to the wiring part 115, and consequently may be electrically connected to one end of the through electrode 120. The front surface connection electrode 130 may include a metal such as copper (Cu), nickel (Ni), or a combination thereof, or a compound of thereof, and it may have a single layer structure or a multi-layer structure.

The front surface connection electrodes 130 may be positioned to overlap with and be coupled to the through electrodes 120, respectively. The front surface connection electrode 130 and the through electrode 120 may be coupled through the wiring part 115. Accordingly, in this embodiment of the present disclosure, three front surface connection electrodes 130 may be arranged in the array region AR in the first direction, and the three front surface connection electrodes 130 may be positioned in the one-side edge region ER1, the central region CR, and the other-side edge region ER2, respectively. Each front surface connection electrode 130 in the first direction may have a second width W2. The second width W2 may be greater than the first width W1 of the through electrode 120.

In this case, in the first direction, the center of the front surface connection electrode 130 of the central region CR may substantially coincide with the center of the through electrode 120 of the central region CR. On the other hand, in the first direction, the center of the front surface connection electrode 130 of each of the one-side edge region ER1 and the other-side edge region ER2 may be positioned at a distance farther from the central region CR than the center of the through electrode 120 of each of the one-side edge region ER1 and the other-side edge region ER2. For example, in the first direction, the center of the front surface connection electrode 130 of the one-side edge region ER1 may be positioned on the left side of the center of the through electrode 120 of the one-side edge region ER1, and the center of the front surface connection electrode 130 of the other-side edge region ER2 may be positioned on the right side of the center of the through electrode 120 of the other-side edge region ER2. However, in this case, the position of the front surface connection electrode 130 in each of the one-side edge region ER1 and the other-side edge region ER2 may be controlled such that the front surface connection electrode 130 overlaps with the whole one end of the through electrode 120. The distance between the center of the through electrode 120 and the center of the front surface connection electrode 130 in each of the one-side edge region ER1 and the other-side edge region ER2 may be denoted by a reference symbol D.

Because the center of the front surface connection electrode 130 is positioned at a distance farther from the central region CR than the center of the through electrode 120 in each of the one-side edge region ER1 and the other-side edge region ER2, the front surface connection electrodes 130 may be arranged to have a second pitch P2 which is greater than the first pitch P1 in the first direction. The second pitch P2 may mean the distance between the center of one front surface connection electrode 130 and the center of a neighboring front surface connection electrode 130. The second pitch P2 may have a substantially constant value. Although it is illustrated in the plan view that each front surface connection electrode 130 has a circular shape, the planar shape of each front surface connection electrode 130 may vary diversely.

The bonding layer 140 may be formed over the front surface connection electrode 130. The bonding layer 140 may be provided to be bonded to other constituent elements (not shown), for example, another semiconductor chip or a substrate, to be coupled to the semiconductor chip 100 while facing the front surface 111 of the semiconductor chip 100.

For example, when a plurality of semiconductor chips 100 are stacked in the vertical direction, the bonding layer 140 may perform a function of being bonded to the rear surface connection electrode facing itself. This will be described in more detail with reference to FIG. 2. The bonding layer 140 may include a solder material having a hemispherical shape, a ball shape, or a similar shape. However, the spirit and concept of the present embodiment is not limited thereto, and the shape and material of the bonding layer 140 may be diversely modified.

The rear surface connection electrode 150 may be formed over the rear surface 112 of the body part 110. The rear surface connection electrodes 150 may be positioned to overlap with and be coupled to the through electrodes 120, respectively. The rear surface connection electrode 150 may directly contact the through electrode 120. Unlike the front surface connection electrode 130, the rear surface connection electrode 150 may directly contact the other end of the through electrode 120. The rear surface connection electrode 150 may include a metal such as copper (Cu), nickel (Ni), or a combination thereof, or may include a compound thereof, and have a single layer structure or a multi-layer structure.

Here, the width and arrangement of the rear surface connection electrode 150 in the first direction may be substantially the same as the width and arrangement of the front surface connection electrode 130. In other words, the rear surface connection electrode 150 and the front surface connection electrode 130 may overlap with each other in a plan view. Accordingly, three rear surface connection electrodes 150 may be arranged in the first direction in the array region AR, and the three rear surface connection electrodes 150 may be positioned in the one-side edge region ER1, the central region CR, and the other-side edge region ER2, respectively. Each rear surface connection electrode 150 in the first direction may have a second width W2. In the first direction, the center of the rear surface connection electrode 150 of the central region CR may substantially coincide with the center of the through electrode 120 of the central region CR. On the other hand, in the first direction, the center of the rear surface connection electrodes 150 of each of the one-side edge region ER1 and the other-side edge region ER2 may be positioned at a distance farther from the central region CR than the center of the through electrode 120 of each of the one-side edge region ER1 and the other-side edge region ER2. The position of the rear surface connection electrode 150 in each of the one-side edge region ER1 and the other-side edge region ER2 may be controlled such that the rear surface connection electrode 150 overlaps with the whole other end of the through electrode 120. The distance between the center of the through electrode 120 and the center of the rear surface connection electrode 150 in each of the one-side edge region ER1 and the other-side edge region ER2 is denoted by a reference symbol D. The rear surface connection electrodes 150 may be arranged to have a second pitch P2 in the first direction. Although it is illustrated in the plan view that each rear surface connection electrode 150 has a circular shape, the planar shape of each rear surface connection electrode 150 may vary diversely.

The effects obtained by the semiconductor chip 100 described above will be described below in comparison with the prior art.

When the center and pitch of the front surface connection electrode and the rear surface connection electrode are the same as the center and pitch of the through electrode as in the prior art, if the pitch of the through electrode is reduced to a required level, the pitch of the front surface connection electrode and the rear surface connection electrode may be reduced. As a result, a sufficient distance may not be secured between the neighboring front surface connection electrodes and between the neighboring rear surface connection electrodes. When a bonding structure including the front surface connection electrode, the rear surface connection electrode, and the bonding layer between the front surface connection electrode and the rear surface connection electrode is formed between the semiconductor chips that are positioned adjacent to each other in the vertical direction by stacking a plurality of the semiconductor chips in the vertical direction, voids may be caused between the bonding structures because it is difficult for a molding material or a gap-fill material to flow through a narrow interval between the bonding structures. These voids may cause process defects, such as bridging between the neighboring bonding structures, particularly, between the neighboring bonding layers. On the other hand, when the pitch of the front surface connection electrode and the rear surface connection electrode is increased together with the pitch of the through electrode, the space for the through electrode and the connection electrodes in the semiconductor chip may increase. This may increase the plane size of the semiconductor chip/semiconductor package.

According to an embodiment of the present disclosure, it is possible to reduce the plane size of the semiconductor chip 100 and a semiconductor package including the semiconductor chip 100 by satisfying the demand for reducing the pitch of the through electrode 120. Also, when a semiconductor package in which a plurality of the semiconductor chips 100 are stacked is realized by increasing the pitch of the front surface connection electrode 130 and the rear surface connection electrode 150, process defects such as bridge of the bonding layer may be reduced.

Figure 1C:
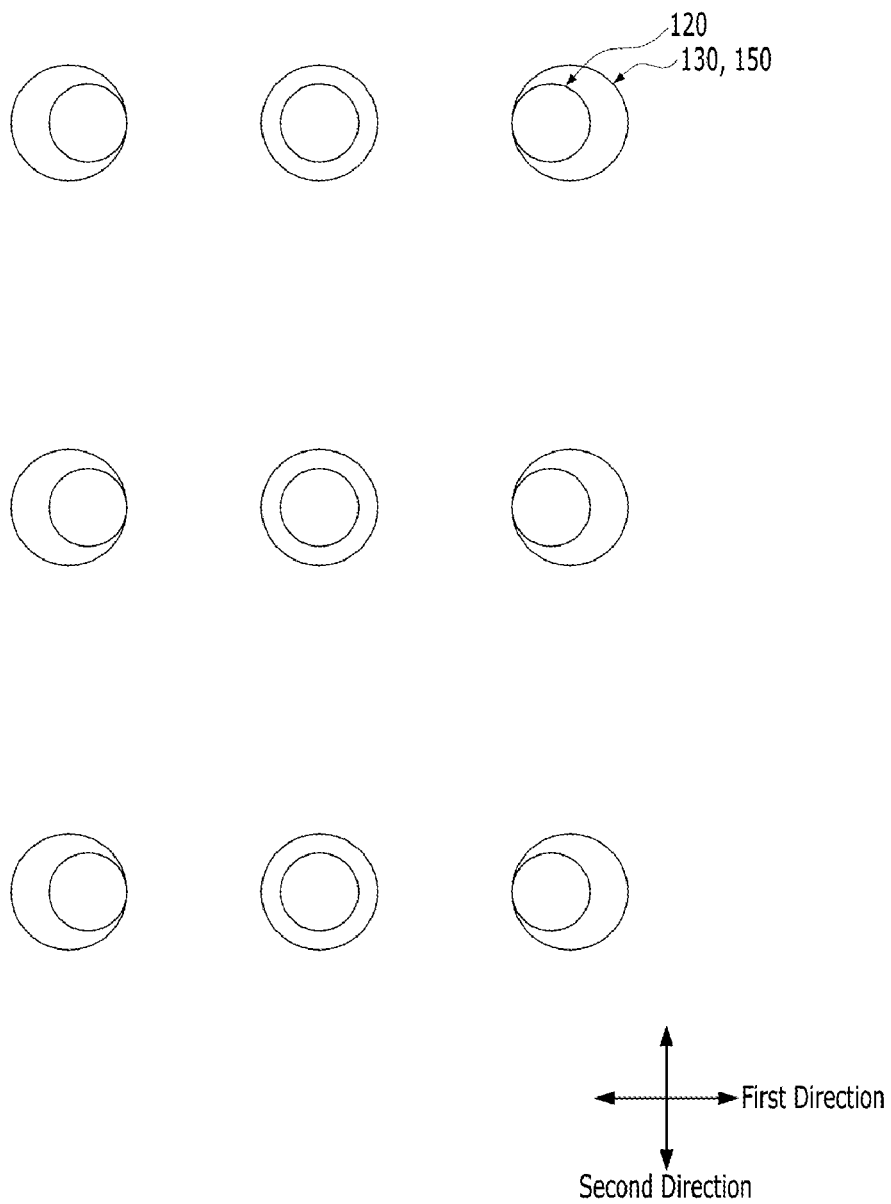
FIG. 1C is a plan view illustrating another example of a region in which through electrodes are arranged.

Meanwhile, the through electrode 120, the front surface connection electrode 130, and the rear surface connection electrode 150 may be arranged not only in the first direction but also in the second direction as well. In other words, they may be arranged in a matrix form in the first and second directions (see FIG. 1C).

Figure 2:
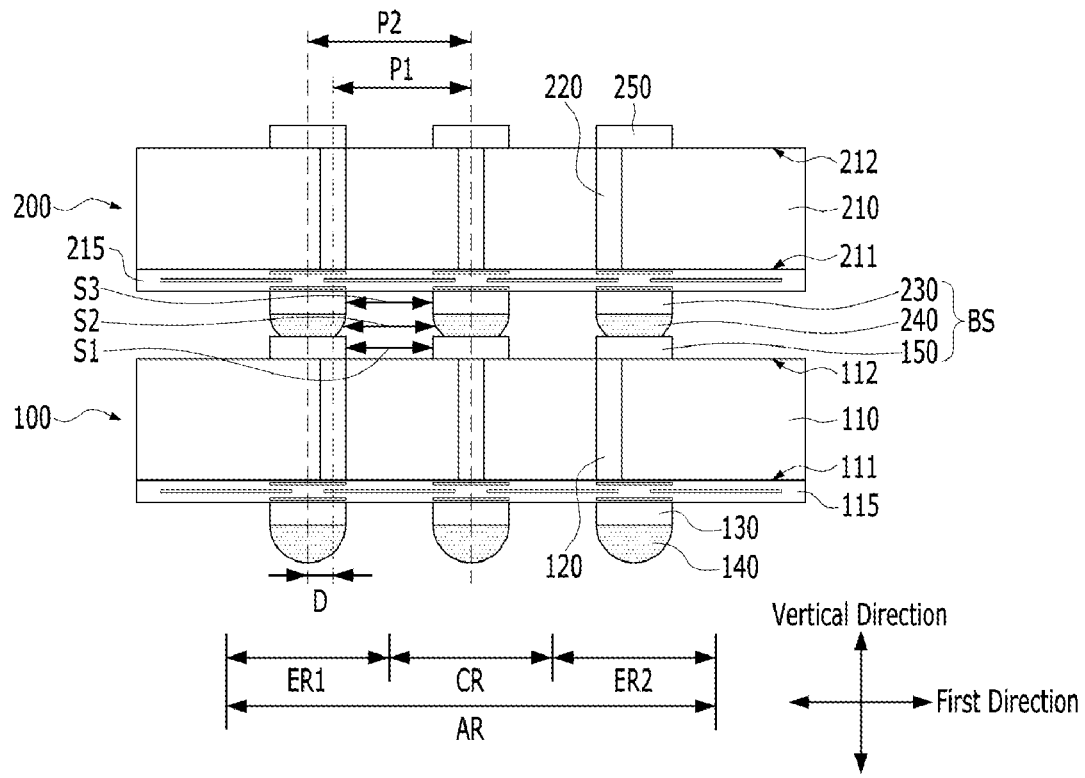
FIG. 2 is a cross-sectional view illustrating stacked semiconductor chips in accordance with an embodiment of the present disclosure.

FIG. 2 is a cross-sectional view illustrating a stacked semiconductor chip in accordance with an embodiment of the present disclosure. FIG. 2 shows a case where two semiconductor chips are stacked in the vertical direction.

Referring to FIG. 2, a second semiconductor chip 200 may be stacked over the first semiconductor chip 100.

The first semiconductor chip 100 may be substantially the same as the semiconductor chip 100 shown in FIG. 1 described above. Thus, the same reference numerals as those of FIG. 1 are used. The first semiconductor chip 100 may include a first body part 110 having a front surface 111 and a rear surface 112, a first wiring part 115 over the front surface 111 of the first body part 110, a first through electrode 120 penetrating the first body part 110, a first front surface connection electrode 130 coupled to the first through electrode 120 through the first wiring part 115 over the first wiring part 115, a first bonding layer 140 over the first front surface connection electrode 130, and the first rear surface connection electrode 150 coupled to the first through electrode 120 over the rear surface 112 of the first body part 110.

Except for the shape of the second bonding layer 240, the second semiconductor chip 200 may also be substantially the same as the semiconductor chip 100 shown in FIG. 1 described above. In other words, the second semiconductor chip 200 may include a second body part 210 having a front surface 211 and a rear surface 212, a second wiring part 215 over the front surface 211 of the second body part 210, a second through electrode 220 penetrating the second body part 210, a second front surface connection electrode 230 coupled to the second through electrode 220 through the second wiring part 215 over the second wiring part 215, a second bonding layer 240 over the second front surface connection electrode 230, and a second rear surface connection electrode 250 coupled to the second through electrode 220 over the rear surface 212 of the second body part 210.

The arrangement and width of the first through electrode 120 and the second through electrode 220 may be substantially the same. In particular, the centers of the first through electrode 120 and the second through electrode 220 may coincide with each other, and the first through electrodes 120 and the second through electrodes 220 may be arranged with the first pitch P1 in the first direction.

The arrangement and width of the first front surface connection electrode 130, the first rear surface connection electrode 150, the second front surface connection electrode 230, and the second rear surface connection electrode 250 may be substantially the same. In particular, the centers of the first front surface connection electrode 130, the first rear surface connection electrode 150, the second front surface connection electrode 230, and the second rear surface connection electrode 250 may coincide with each other. The first front surface connection electrodes 130, the first rear surface connection electrodes 150, the second front surface connection electrodes 230, and the second rear surface connection electrodes 250 may be arranged with a second pitch P2 in the first direction.

Here, in the central region CR, the centers of the first front surface connection electrode 130, the first rear surface connection electrode 150, the second front surface connection electrode 230, and the second rear surface connection electrode 250 may coincide with the centers of the first and second through electrodes 120 and 220. On the other hand, in the one-side edge region ER1, the centers of the first front surface connection electrode 130, the first rear surface connection electrode 150, the second front surface connection electrode 230, and the second rear surface connection electrode 250 may be positioned at a distance farther from the central region CR than the centers of the first and second through electrodes 120 and 220, for example, on the left side. Also, in the other-side edge region ER2, the centers of the first front surface connection electrode 130, the first rear surface connection electrode 150, the second front surface connection electrode 230, and the second rear surface connection electrode 250 may be positioned at a distance farther from the central region CR than the centers of the first and second through electrodes 120 and 220, for example, on the right side. Therefore, the second pitch P2 may be greater than the first pitch P1. In each of the one-side edge region ER1 and the other-side edge region ER2, the distance between the centers of the first front surface connection electrode 130, the first rear surface connection electrode 150, the second front surface connection electrode 230, and the second rear surface connection electrode 250 and the centers of the first and second through electrodes 120 and 220 is denoted by a reference symbol D.

The second semiconductor chip 200 may be stacked over the first semiconductor chip 100 with the front surface 211 facing the rear surface 112 of the first semiconductor chip 100. More specifically, the second bonding layer 240 of the second semiconductor chip 200 may be bonded to the first rear surface connection electrode 150 of the first semiconductor chip 100 by a bonding process. During the bonding process, the shape of the second bonding layer 240 may be different from the shape of the first bonding layer 140.

Accordingly, a bonding structure BS formed of the first rear surface connection electrode 150, the second bonding layer 240, and the second front surface connection electrode 230 may be formed between the first semiconductor chip 100 and the second semiconductor chip 200. A plurality of the bonding structures BS may be arranged with the second pitch P2 in the first direction.

In the stacked structure of the first and second semiconductor chips 100 and 200 described above, the second pitch P2 of the bonding structure BS may be greater than the first pitch P1 of the first and second through electrodes 120 and 220. Thus, the spacings S1, S2, and S3 between the bonding structures BS may be secured widely. More specifically, the spacing S1 between the first rear surface connection electrodes 150, the spacing S2 between the second bonding layers 240, and the spacing S3 between the second front surface connection electrodes 230 may be secured widely. Therefore, when the space between the first semiconductor chip 100 and the second semiconductor chip 200 is filled with a molding material or a gap-fill material (see 810 in FIG. 8), the flow of the molding material/gap-fill material may be made smooth. In this way, it is possible to reduce or prevent the formation of voids between the bonding structures BS and the procedural defects from occurring.

According to an embodiment of the present disclosure, two semiconductor chips 100 and 200 are stacked in the vertical direction, as described, but the concept and spirit of the present disclosure are not limited thereto. According to another embodiment of the present disclosure, three or more semiconductor chips may be repeatedly stacked in the vertical direction. Accordingly, it may be possible to realize a high-density semiconductor package in which a plurality of semiconductor chips are stacked in the vertical direction.

Meanwhile, in the above embodiments of the present disclosure, a case where the number of through electrodes, front surface connection electrodes, and rear surface connection electrodes arranged in the first direction is three is described, but the present disclosure is not limited thereto, and the number may vary diversely. Hereinafter, a description will be given with reference to FIGS. 3 to 5. In describing additional embodiments of the present disclosure, descriptions will be made focusing on the differences from above-described embodiments.

Figure 3:
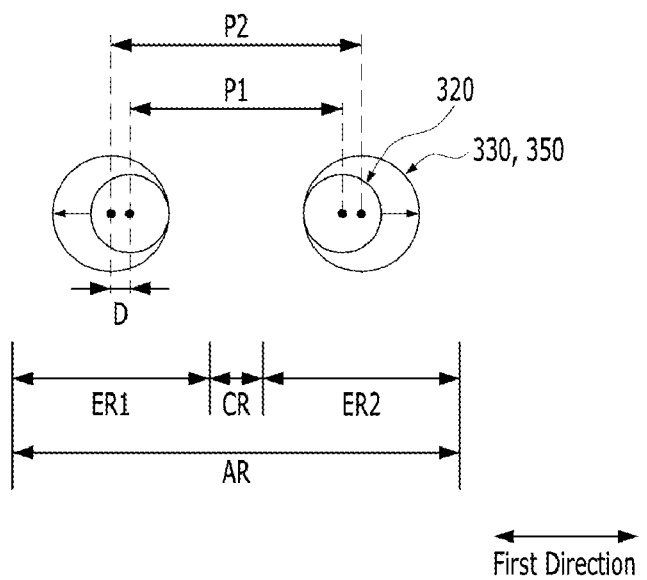
FIG. 3 is a plan view illustrating a region in which through electrodes of a semiconductor chip are arranged in accordance with another embodiment of the present disclosure.

FIG. 3 is a plan view illustrating a region in which through electrodes of a semiconductor chip are arranged in accordance with another embodiment of the present disclosure.

Referring to FIG. 3, two through electrodes 320 may be arranged to have the first pitch P1 in the first direction in the array region AR including the central region CR, the one-side edge region ER1, and the other-side edge region ER2. The two through electrodes 320 may be positioned in the one-side edge region ER1 and the other-side edge region ER2, respectively. A through electrode might not be positioned in the central region CR.

The front surface connection electrode 330 and the rear surface connection electrode 350 may be formed to overlap with and be coupled to the through electrodes 320, respectively, over the front and rear surfaces of the body part (not shown). For reference, the front surface connection electrode 330 may be coupled to the through electrode 320 through the wiring part over the front surface of the body part, and the rear surface connection electrode 350 may directly contact the through electrode 320. Accordingly, two front surface connection electrodes 330 may be positioned in the one-side edge region ER1 and the other-side edge region ER2, respectively, and two rear surface connection electrodes 350 may be positioned in the one-side edge region ER1 and the other-side edge region ER2, respectively. A front surface connection electrode 330 and a rear surface connection electrode might not be positioned in the central region CR.

Here, in the first direction, the centers of the front surface connection electrode 330 and the rear surface connection electrode 350 of the one-side edge region ER1 and the other-side edge region ER2 may be positioned at a distance farther from the central region CR than the centers of the one-side edge region ER1 and the other-side edge region ER2. For example, in the first direction, the centers of the front surface connection electrode 330 and the rear surface connection electrode 350 of the one-side edge region ER1 may be positioned on the left side of the center of the through electrode 320 of the one-side edge region ER1. The centers of the front surface connection electrode 330 and the rear surface connection electrode 350 of the other-side edge region ER2 may be positioned on the right side of the center of the through electrode 320 of the other-side edge region ER2. Accordingly, a plurality of the front surface connection electrodes 330 may be arranged to have the second pitch P2 that is greater than the first pitch P1 in the first direction, and a plurality of the rear surface connection electrodes 350 may be positioned to have the second pitch P2 that is greater than the first pitch P1 in the direction. The distance between the centers of the front surface connection electrode 330 and the rear surface connection electrode 350 and the center of the through electrode 320 is denoted by a reference symbol D.

Figure 4:
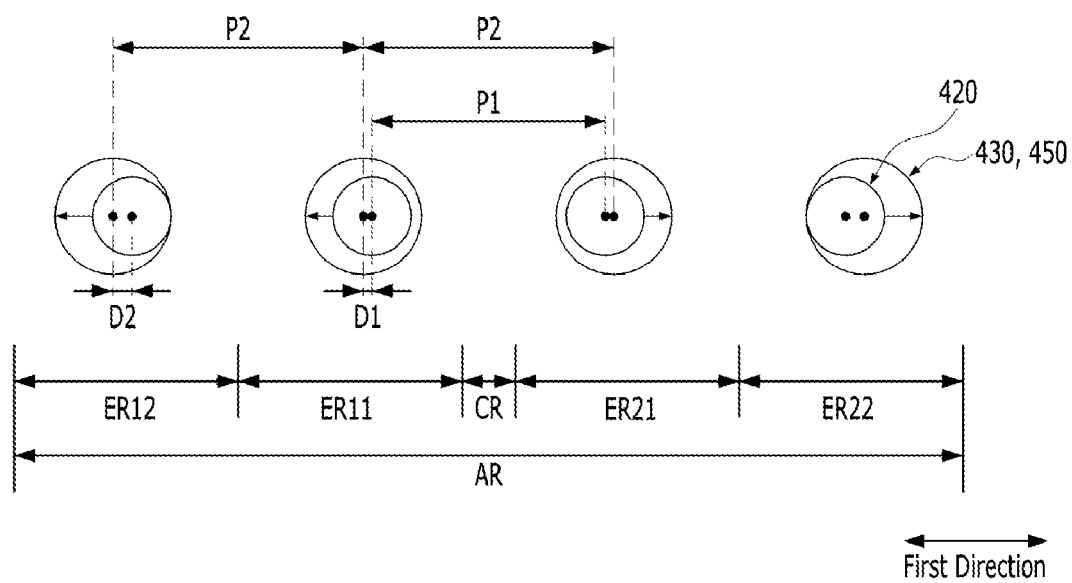
FIG. 4 is a plan view illustrating a region in which through electrodes of a semiconductor chip are arranged in accordance with another embodiment of the present disclosure.

FIG. 4 is a plan view illustrating a region in which through electrodes of a semiconductor chip are arranged in accordance with another embodiment of the present disclosure.

Referring to FIG. 4, four through electrodes 420 may be positioned to have the first pitch P1 in the first direction in the array region AR including the central region CR, one-side edge regions ER11 and ER12, and the other-side edge regions ER21 and ER22. One-side edge regions ER11 and ER12 may include a first one-side edge region ER11 and a second one-side edge region ER12 that are sequentially positioned according to the distance from the central region CR. The other-side edge regions ER21 and ER22 may include a first other-side edge region ER21 and a second other-side edge region ER22 that are sequentially positioned according to the distance from the central region CR. The four through electrodes 420 may be positioned in the first one-side edge region ER11, the second one-side edge region ER12, the first other-side edge region ER21, and the second edge region ER22, respectively. A through electrode might not be positioned in the central region CR.

A front surface connection electrode 430 and a rear surface connection electrode 450 may be formed to overlap with and be coupled to the through electrodes 420 on the front surface and the rear surface of the body part (not shown). Accordingly, four front surface connection electrodes 430 may be positioned in the first one-side edge region ER11, the second one-side edge region ER12, the first other-side edge region ER21, and the second other-side edge region ER22, respectively. Also, four rear surface connection electrodes 450 may be positioned in the first one-side edge region ER11, the second one-side edge region ER12, the first other-side edge region ER21, and the second other-side edge region ER22, respectively. A front surface connection electrode 430 and a rear surface connection electrode might not be positioned in the central region CR.

In the first direction, the centers of the front surface connection electrode 430 and the rear surface connection electrode 450 of the first one-side edge region ER11 and the first other-side edge region ER21 may be positioned at a distance farther from the central region CR than the centers of the through electrodes 420 of the first one-side edge region ER11 and the first other-side edge region ER21. For example, in the first direction, the centers of the front surface connection electrode 430 and the rear surface connection electrode 450 of the first one-side edge region ER11 may be positioned on the left side of the center of the through electrode 420 of the first one-side edge region ER11, and the centers of the front surface connection electrode 430 and the rear surface connection electrode 450 of the first other-side edge region ER21 may be positioned on the right side of the center of the through electrode 420 of the first other-side edge region ER21. The distance between the centers of the front surface connection electrode 430 and the rear surface connection electrode 450 and the center of the through electrode 420 in the first one-side edge region ER11 and the first other-side edge region ER21 may be referred to as a first distance D1.

Also, in the first direction, the centers of the front surface connection electrode 430 and the rear surface connection electrode 450 of the second one-side edge region ER12 and the second other-side edge region ER22 may be positioned at a distance farther from the central region CR than the centers of the through electrodes 420 of the second one-side edge region ER12 and the second other-side edge region ER22. For example, in the first direction, the centers of the front surface connection electrode 430 and the rear surface connection electrode 450 of the second one-side edge region ER12 may be positioned on the left side of the center of the through electrode 420 of the second one-side edge region ER12, and the centers of the front surface connection electrode 430 and the rear surface connection electrode 450 of the second other-side edge region ER22 may be positioned on the right side of the center of the through electrode 420 of the second other-side edge region ER22. The distance between the centers of the front surface connection electrode 430 and the rear surface connection electrode 450 and the center of the through electrode 420 in the second one-side edge region ER12 and the second other-side edge region ER22 may be referred to as a second distance D2.

In this case, the second distance D2 may be greater than the first distance D1. In other words, as it becomes farther from the central region CR, the distance between the center of the through electrode 420 and the centers of the front surface connection electrode 430 and the rear surface connection electrode 450 may increase. Even in this case, the pitches of the front surface connection electrode 430 and the rear surface connection electrode 450 may be substantially constant. In other words, a plurality of the front surface connection electrodes 430 may be arranged to have the second pitch P2 which is greater than the first pitch P1 in the first direction, and a plurality of the rear surface connection electrodes 450 may be arranged to have the second pitch P2 which is greater than the first pitch P1 in the first direction.

Referring to FIGS. 3 and 4, a case where an even number of through electrodes are arranged in the array region will be described below.

The array region may include a central region and first to $N^{th}$ edge regions (where N is a natural number of 2 or more) that are sequentially arranged according to the distance from the central region on both sides of the central region.

The even number of through electrodes may be positioned in the first to $N^{th}$ edge regions on one side of the central region and the first to $N^{th}$ edge regions on the other side of the central region, respectively. The through electrode may not be positioned in the central region. Also, the front surface connection electrode and the rear surface connection electrode overlapping with and coupled to the even number of through electrodes, respectively, may be positioned in the first to $N^{th}$ edge regions on one side of the central region and the first to $N^{th}$ edge regions on the other side of the central region.

In each of the first to $N^{th}$ edge regions, the centers of the front surface connection electrode and the rear surface connection electrode may be positioned at a distance farther from the central region than the center of the through electrode. Herein, the distance between the centers of the front surface connection electrode and the rear surface connection electrode of a $k^{th}$ edge region (where k is a natural number between 1 and N−1) and the center of the through electrode may be smaller than the distance between the centers of the front surface connection electrode and the rear surface connection electrode of a $(k+1)^{th}$ edge region and the center of the through electrode.

Even in this case, the pitches of the front surface connection electrode and the rear surface connection electrode may be substantially constant and may be greater than the pitch of the through electrode.

Figure 5:
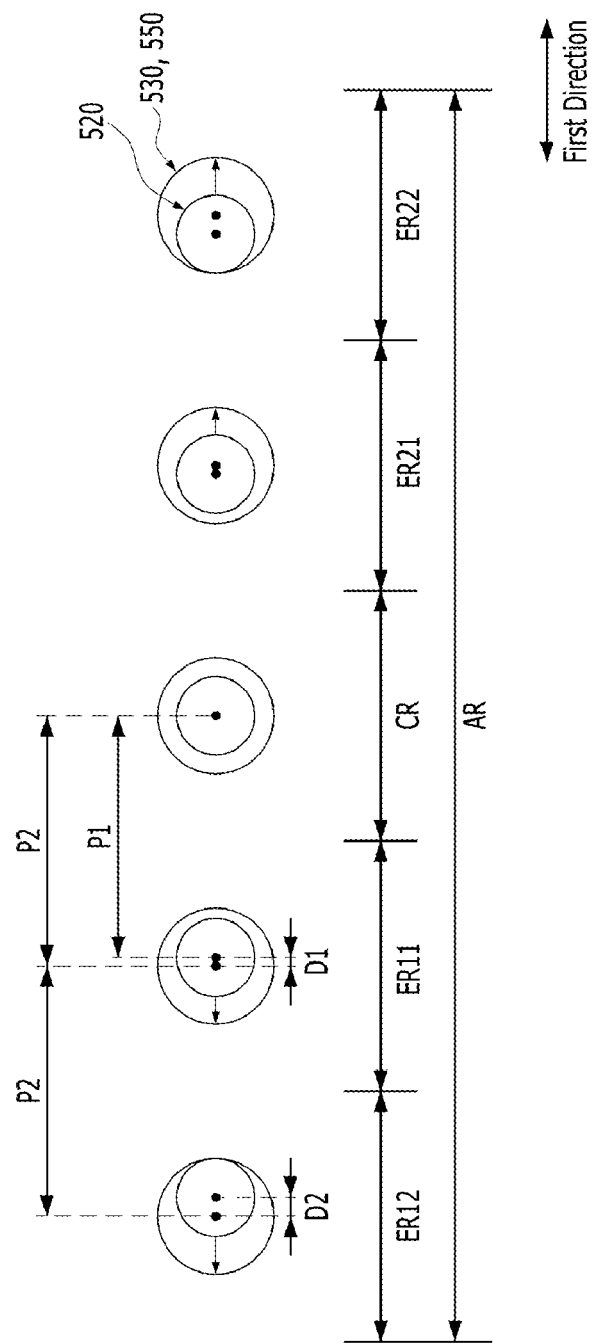
FIG. 5 is a plan view illustrating a region in which through electrodes of a semiconductor chip are arranged in accordance with another embodiment of the present disclosure.

FIG. 5 is a plan view illustrating a region in which through electrodes of a semiconductor chip are arranged in accordance with another embodiment of the present disclosure.

Referring to FIG. 5, five through electrodes 520 may be arranged to have a first pitch P1 in the first direction in the array region AR including a central region CR, one-side edge regions ER11 and ER12, and the other-side edge regions ER21 and ER22. The one-side edge regions ER11 and ER12 may include a first one-side edge region ER11 and a second one-side edge region ER12 that are sequentially arranged according to the distance from the central region CR. The other-side edge regions ER21 and ER22 may include a first other-side edge region ER21 and a second other-side edge region ER22 that are sequentially arranged according to the distance from the central region CR. The five through electrodes 520 may be positioned in the central region CR, the first one-side edge region ER11, the second one-side edge region ER12, the first other-side edge region ER21, and the second other-side edge regions ER22, respectively.

The front surface connection electrode 530 and the rear surface connection electrode 550 may be formed to overlap with and be coupled to the through electrodes 520 on the front surface connection electrode and the rear surface connection electrode of the body part (not shown). Accordingly, the five front surface connection electrodes 530 may be positioned in the central region CR, the first one-side edge region ER11, the second one-side edge region ER12, the first other-side edge region ER21, and the second other-side edge region ER22, respectively, and the five rear surface connection electrodes 550 may be positioned in the central region CR, the first one-side edge region ER11, the second one-side edge region ER12, the first other-side edge region ER21, and the second other-side edge region ER22, respectively.

In the first direction, the centers of the front surface connection electrodes 530 and the rear surface connection electrodes 550 of the central region CR may substantially coincide with the center of the through electrode 520 of the central region CR.

On the other hand, in the first direction, the centers of the front surface connection electrode 530 and the rear surface connection electrode 550 of each of the first one-side edge region ER11 and the first other-side edge region ER21 may be positioned at a distance farther from the central region than the center of the through electrode 520 of each of the first one-side edge region ER11 and the first other-side edge region ER21. For example, in the first direction, the centers of the front surface connection electrode 530 and the rear surface connection electrode 550 of the first one-side edge region ER11 may be positioned on the left side of the center of the through electrode 520 of the first one-side edge region ER11, and the centers of the front surface connection electrode 530 and the rear surface connection electrode 550 of the first other-side edge region ER21 may be positioned on the right side of the center of the through electrode 520 of the first other-side edge region ER21. The distance between the centers of the front surface connection electrode 530 and the rear surface connection electrode 550 and the center of the through electrode 520 in each of the first one-side edge region ER11 and the first other-side edge region ER21 may be referred to as a first distance D1.

Also, in the first direction, the centers of the front surface connection electrode 530 and the rear surface connection electrode 550 of each of the second one-side edge region ER12 and the second other-side edge region ER22 may be positioned at a distance farther from the central region than the center of the through electrode 520 of each of the second one-side edge region ER12 and the second other-side edge region ER22. For example, in the first direction, the centers of the front surface connection electrode 530 and the rear surface connection electrode 550 of the second one-side edge region ER12 may be positioned on the left side of the center of the through electrode 520 of the second one-side edge region ER12, and the centers of the front surface connection electrode 530 and the rear surface connection electrode 550 of the second other-side edge region ER22 may be positioned on the right side of the center of the through electrode 520 of the second other-side edge region ER22. The distance between the centers of the front surface connection electrode 530 and the rear surface connection electrode 550 and the center of the through electrode 520 in each of the second one-side edge region ER12 and the second other-side edge region ER22 may be referred to as a second distance D2.

In this case, the second distance D2 may be greater than the first distance D1. In other words, as it becomes farther from the central region CR, the distance between the center of the through electrode 520 and the centers of the front surface connection electrode 530 and the rear surface connection electrode 550 may increase. Even in this case, the pitches of the front surface connection electrode 530 and the rear surface connection electrode 550 may be substantially constant. In other words, the front surface connection electrodes 530 may be arranged to have the second pitch P2 which is greater than the first pitch P1 in the first direction, and a plurality of rear surface connection electrodes 550 may be arranged to have the second pitch P2 which is greater than the first pitch P1 in the first direction.

Referring to FIGS. 1B and 5, a case where an odd number of through electrodes are arranged in the array region will be described below.

The array region may include a central region and first to $N^{th}$ edge regions (where N is a natural number of 2 or more) that are sequentially arranged according to the distance from the central region on both sides of the central region.

The odd number of the through electrodes may be positioned in the central region, the first to $N^{th}$ edge regions on one side of the central region, and the first to $N^{th}$ edge regions on the other side of the central region, respectively. Also, the front surface connection electrode and the rear surface connection electrode overlapping with and coupled to the odd number of the through electrodes may be positioned in the central region, the first to $N^{th}$ edge regions on one side of the central region, and the first to $N^{th}$ edge regions on the other side of the central region.

In the central region, the centers of the front surface connection electrode and the rear surface connection electrode may substantially coincide with the center of the through electrode. In each of the first to $N^{th}$ edge regions, the centers of the front surface connection electrode and the rear surface connection electrode may be positioned at a distance farther from the central region than the center of the through electrode. Herein, the distance between the centers of the front surface connection electrode and the rear surface connection electrode of the $k^{th}$ edge region (where k is a natural number between 1 and N−1) and the center of the through electrode may be smaller than the distance between the centers of the front surface connection electrode and the rear surface connection electrode of the $(k+1)^{th}$ edge region and the center of the through electrode.

Even in this case, too, the pitches of the front surface connection electrode and the rear surface connection electrode may be substantially constant and may be greater than the pitch of the through electrode.

Meanwhile, the through electrodes of the above-described embodiments of the present disclosure may be arranged in a plurality of groups in the first direction. This will be described with reference to FIGS. 6 and 7. In describing the embodiments of the present disclosure, description will be made focusing on the differences from the above-described embodiments.

Figure 6:
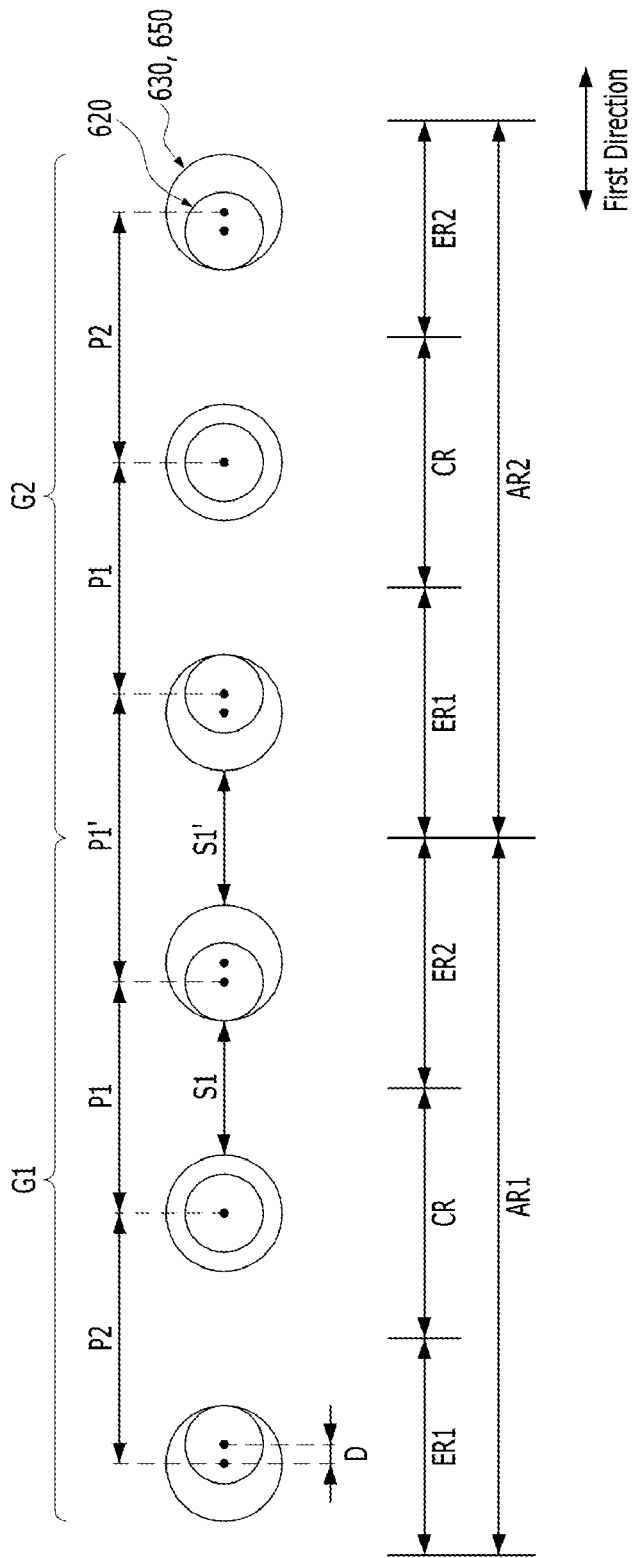
FIG. 6 is a plan view illustrating a region in which through electrodes of a semiconductor chip are arranged in accordance with another embodiment of the present disclosure.

FIG. 6 is a plan view illustrating a region in which through electrodes of a semiconductor chip are arranged in accordance with another embodiment of the present disclosure. FIG. 6 shows a case where a group includes three through electrodes of FIG. 1B and two groups are positioned in the first direction.

Referring to FIG. 6, first and second array regions AR1 and AR2 positioned adjacent to each other in the first direction may be provided. Each of the first and second array regions AR1 and AR2 may include a central region CR, a one-side edge region ER1, and an other-side edge region ER2.

The through electrodes 620 of a first group G1 may be arranged in the first array region AR1, and the through electrodes 620 of a second group G2 may be arranged in the second array region AR2. The arrangement of the through electrodes 620 of each of the first group G1 and the second groups G2 may be substantially the same as the arrangement of the through electrodes 120 shown in FIG. 1B. In other words, the three through electrodes 620 in each of the first array region AR1 and the second array region AR2 may be positioned in the central region CR, the one-side edge region ER1, and the other-side edge region ER2, respectively, to have a first pitch P1 in the first direction.

On the other hand, the distance P1' between the center of the through electrode 620 of the other-side edge region ER2 of the first array region AR1 and the center of the through electrode 620 of the one-side edge region ER1 of the second array region AR2 adjacent thereto may be greater than the first pitch P1. In other words, pitch variation of the through electrode 620 may occur between the first array region AR1 and the second array region AR2.

The front surface connection electrodes 630 and the rear surface connection electrodes 650 of the first group G1 may be arranged in the first array region AR1, and the front surface connection electrodes 630 and the rear surface connection electrodes 650 of the second group G2 may be arranged in the second array region AR2. The arrangement of the front surface connection electrode 630 and the rear surface connection electrode 650 of each of the first group G1 and the second group G2 may be substantially the same as the arrangement of the front surface connection electrode 130 and the rear surface connection electrode 150 of FIG. 1B. In other words, three front surface connection electrodes 630 and three rear surface connection electrodes 650 may be positioned in the central region CR, the one-side edge region ER1, and the other-side edge region ER2, respectively, in each of the first array region AR1 and the second array region AR2, and may be arranged to have a second pitch P2 in the first direction. In particular, in each of the first array region AR1 and the second array region AR2, the centers of the front surface connection electrode 630 and the rear surface connection electrode 650 of each of the one-side edge region ER1 and the other-side edge region ER2 may be positioned at a distance farther from the central region CR than the center of the through electrode 620 of each of the one-side edge region ER1 and the other-side edge region ER2. For example, the centers of the front surface connection electrode 630 and the rear surface connection electrode 650 of the one-side edge region ER1 may be positioned on the left side of the center of the through electrode 620 of the one-side edge region ER1. The centers of the front surface connection electrode 630 and the rear surface connection electrode 650 of the other-side edge region ER2 may be positioned on the right side of the center of the through electrode 620 of the other-side edge region ER2. The distance between the centers of the front surface connection electrode 630 and the rear surface connection electrode 650 and the center of the through electrode 620 may be denoted by a reference symbol D.

Here, while the centers of the front surface connection electrode 630 and the rear surface connection electrode 650 of the other-side edge region ER2 of the first array region AR1 are positioned on the right side of the center of the through electrode 620, the centers of the front surface connection electrode 630 and the rear surface connection electrode 650 of the one-side edge region ER1 of the second array region AR2 may be positioned on the left side of the center of the through electrodes 620. Thus, there is a possibility that the distance S1' between the front surface connection electrode 630 and the rear surface connection electrode 650 of the other-side edge region ER2 of the first array region AR1 and the front surface connection electrode 630 and the rear surface connection electrode 650 of the one-side edge region ER1 of the second array region AR2 may decrease. However, in this embodiment of the present disclosure, as described above, by increasing the distance P1' between the center of the through electrode 620 of the other-side edge region ER2 of the first array region AR1 and the center of the through electrode 620 of the one-side edge region ER1 of the second array region AR2 by the first pitch P1, it may be possible to prevent the distance S1' from decreasing. This distance S1' may be substantially the same as the distance S1 between the neighboring front surface connection electrodes 630 and/or between the neighboring rear surface connection electrodes 650 in each of the first array region AR1 and the second array region AR2. The pitches of the front surface connection electrode 630 and the rear surface connection electrode 650 between the first array region AR1 and the second array region AR2 may be maintained substantially the same as the second pitch P2. In other words, the distance between the centers of the front surface connection electrodes 630 and the rear surface connection electrodes 650 of the other-side edge region ER2 of the first array region AR1 and the centers of the front surface connection electrodes 630 and the rear surface connection electrodes 650 of the one-side edge region ER1 of the second array region AR2 may be substantially the same as the second pitch P2.

According to an embodiment of the present disclosure, all the effects of the above-described embodiment may be obtained. Furthermore, even though the number of the through electrodes 620 arranged in the first direction is large, it may not have to adjust the distance between the center of the through electrode 620 and the centers of the front surface connection electrodes 630 and the rear surface connection electrodes 650 in several steps, which reduces the procedural difficulty.

Although not illustrated, groups of three or more through electrodes and front surface and rear surface connection electrodes may be arranged in the first direction. In this case, the arrangement of each group and the arrangement between the groups may be substantially the same as those described in this drawing.

Figure 7:
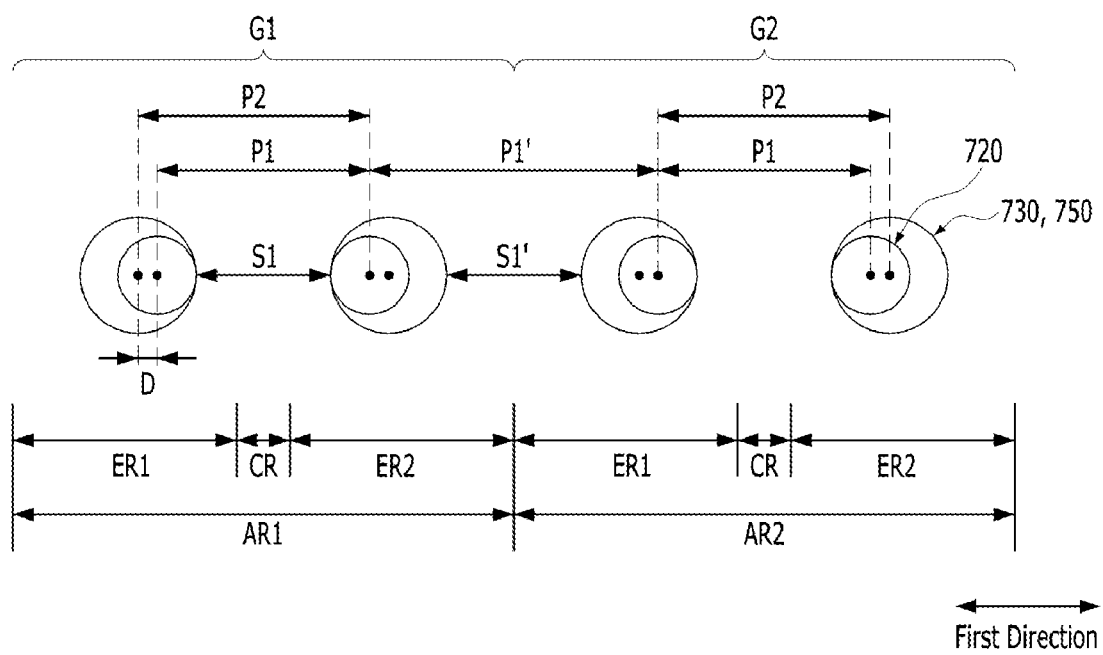
FIG. 7 is a plan view illustrating a region in which through electrodes of a semiconductor chip are arranged in accordance with another embodiment of the present disclosure.

FIG. 7 is a plan view illustrating a region in which through electrodes of a semiconductor chip are arranged in accordance with another embodiment of the present disclosure. FIG. 7 shows a case where a group includes two through electrodes of FIG. 3 and two groups are positioned in the first direction.

Referring to FIG. 7, the through electrodes 720 of the first group G1 may be arranged in the first array region AR1, and the through electrodes 720 of the second group G2 may be arranged in the second array region AR2. The arrangement of the through electrodes 720 of each of the first group G1 and the second group G2 may be substantially the same as the arrangement of the through electrodes 320 of FIG. 3. In other words, in each of the first array region AR1 and the second array region AR2, two through electrodes 720 may be positioned in the one-side edge region ER1 and the other-side edge region ER2, respectively, excluding the central region CR, and may be arranged to have the first pitch P1 in the first direction.

On the other hand, the distance P1' between the center of the through electrode 720 of the other-side edge region ER2 of the first array region AR1 and the center of the through electrode 720 of the one-side edge region ER1 of the second array region AR2 adjacent thereto may be greater than the first pitch P1.

The front surface connection electrode 730 and the rear surface connection electrode 750 of the first group G1 may be arranged in the first array region AR1, and the front surface connection electrodes 730 and the rear surface connection electrodes 750 of the second group G2 may be arranged in the second array region AR2. The arrangement of the front surface connection electrode 730 and the rear surface connection electrode 750 of each of the first group G1 and the second group G2 may be substantially the same as the arrangement of the front surface connection electrode 330 and the rear surface connection electrode 350 of FIG. 3. In other words, two front surface connection electrodes 730 and two rear surface connection electrodes 750 in each of the first array region AR1 and the second array region AR2 may be positioned in the one-side edge region ER1 and the other-side edge region ER2 excluding the central region CR and may be arranged to have the second pitch P2 in the first direction. In particular, in each of the first array region AR1 and the second array region AR2, the centers of the front surface connection electrode 730 and the rear surface connection electrode 750 of each of the one-side edge region ER1 and the other-side edge region ER2 may be positioned at a distance farther from the central region CR than the centers of the through electrodes 720 of each of the one-side edge region ER1 and the other-side edge region ER2. For example, the centers of the front surface connection electrode 730 and the rear surface connection electrode 750 of the one-side edge region ER1 may be positioned on the left side of the center of the through electrode 720 of the one-side edge region ER1. The centers of the front surface connection electrode 730 and the rear surface connection electrode 750 of the other-side edge region ER2 may be positioned on the right side of the center of the through electrode 720 of the other-side edge region ER2. The distance between the centers of the front surface connection electrode 730 and the rear surface connection electrode 750 and the center of the through electrode 720 may be denoted by a reference symbol D.

Here, while the centers of the front surface connection electrode 730 and the rear surface connection electrode 750 of the other-side edge region ER2 of the first array region AR1 are positioned on the right side of the center of the through electrode 720, the centers of the front surface connection electrode 730 and the rear surface connection electrode 750 of the one-side edge region ER1 of the second array region AR2 may be positioned on the left side of the center of the through electrode 720. Thus, there may be a possibility that the distance S1' between the front surface connection electrode 730 and the rear surface connection electrode 750 of the other-side edge region ER2 of the first array region AR1 and the front surface connection electrode 730 and rear surface connection electrode 750 of the one-side edge region ER1 of the second array region AR2 may decrease. However, in this embodiment of the present disclosure, as described above, by increasing the distance P1' between the center of the through electrode 720 of the other-side edge region ER2 of the first array region AR1 and the center of the through electrode 720 of the one-side edge region ER1 of the second array region AR2 more than the first pitch P1, it may be possible to prevent the distance S1' from decreasing. This distance S1' may be substantially the same as the distance S1 between the neighboring front surface connection electrodes 730 and/or between the neighboring rear surface connection electrodes 750 in each of the first array region AR1 and the second array region AR2. In other words, the pitches of the front surface connection electrode 730 and the rear surface connection electrode 750 between the first array region AR1 and the second array region AR2 may be maintained substantially the same as the second pitch P2.

Although not illustrated, when a plurality of through electrodes included in FIG. 4 or FIG. 5 is referred to as a group, two or more groups may be disposed in the first direction.

Figure 8:
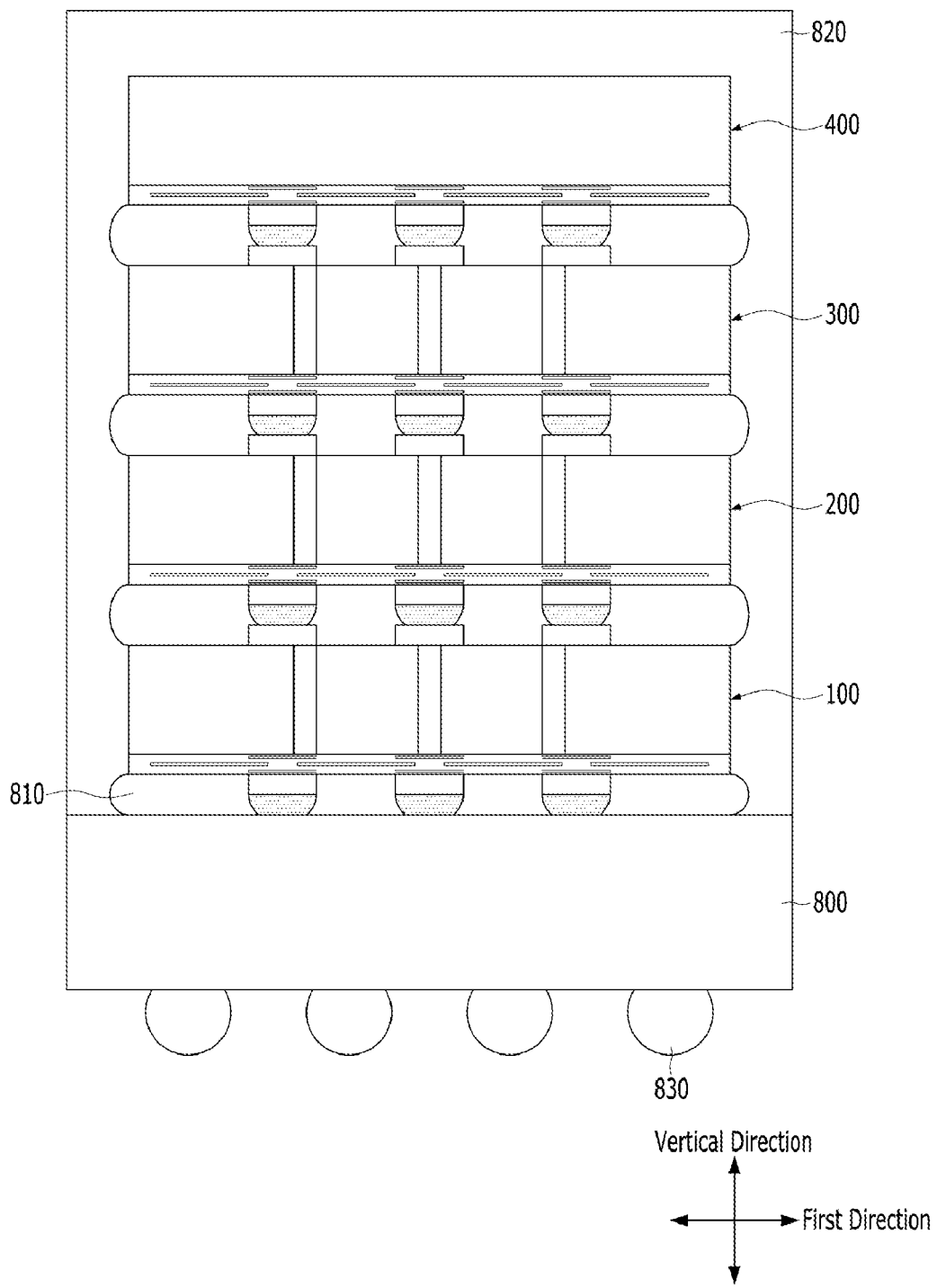
FIG. 8 is a cross-sectional view illustrating a semiconductor package in accordance with an embodiment of the present disclosure.

FIG. 8 is a cross-sectional view illustrating a semiconductor package in accordance with an embodiment of the present disclosure. The semiconductor package of the present embodiment may include a plurality of semiconductor chips that are stacked in the vertical direction. The semiconductor chips may be substantially the same as the semiconductor chips of the above-described embodiments.

Referring to FIG. 8, the semiconductor package in accordance with the present embodiment may include a base layer 800 and a plurality of semiconductor chips 100, 200, 300, and 400 that are stacked over the base layer 800 in the vertical direction. In this embodiment of the present disclosure, a case where four semiconductor chips 100, 200, 300, and 400 are stacked is illustrated, but the present disclosure is not limited thereto, and the number of semiconductor chips stacked in the vertical direction may be modified diversely. For the sake of convenience in description, the four semiconductor chips 100, 200, 300, and 400 may be respectively referred to as the first semiconductor chip 100, the second semiconductor chip 200, the third semiconductor chip 300, and the fourth semiconductor chip 400 in order of increasing distance from the base layer 800.

The base layer 800 may be a layer having a circuit and/or wiring structure in order to connect the stacked structure of the semiconductor chips 100, 200, 300, and 400 to an external constituent element. For example, the base layer 800 may include a substrate such as a printed circuit board (PCB), an interposer, a re-wiring layer, and the like. Alternatively, when the semiconductor chips 100, 200, 300, and 400 are memory chips, the base layer 800 may be a semiconductor chip including a logic circuit that supports the operation of the memory chips, for example, an operation of reading data from a memory chip or writing data into a memory chip.

The base layer 800 may include an upper surface on which the semiconductor chips 100, 200, 300, and 400 are disposed, and a lower surface which is the opposite side of the upper surface and includes an external coupling terminal 830 disposed thereon to couple the semiconductor package to an external constituent element.

Each of the first to third semiconductor chips 100, 200, and 300 except the fourth semiconductor chip 400 positioned on top of the first to fourth semiconductor chips 100, 200, 300, and 400 may be realized substantially the same as one semiconductor chip among the semiconductor chips of the above-described embodiments of the present disclosure. Because the fourth semiconductor chip 400 is positioned on top, it might not include a through electrode and a rear surface connection electrode.

The space between the base layer 800 and the first semiconductor chip 100, between the first semiconductor chip 100 and the second semiconductor chip 200, between the second semiconductor chip 200 and the third semiconductor chip 300, and between the third semiconductor chip 300 and the fourth semiconductor chip 400 may be filled with a gap-fill material 810. The gap-fill material 810 may be formed by flowing an under-fill material into the space based on the capillary phenomenon and then curing.

Also, the base layer 800 and the first to fourth semiconductor chips 100, 200, 300, and 400 may be surrounded by a molding layer 820. In other words, the molding layer 820 may be formed to cover the first to fourth semiconductor chips 100, 200, 300, and 400 over the upper surface of the base layer 800. The molding layer 820 may include diverse molding materials, such as EMC (Epoxy Mold Compound). As an example, when the gap-fill material 810 is omitted, the molding layer 820 may be formed to fill the space between the base layer 800 and the first semiconductor chip 100, between the first semiconductor chip 100 and the second semiconductor chip 200, between the second semiconductor chip 200 and the third semiconductor chip 300, and between the third semiconductor chip 300 and the fourth semiconductor chip 400.

According to some semiconductor packages consistent with this embodiment, all of the advantages described in the above-described embodiments may be obtained. In particular, because the pitch between the bonding structures each of which is formed of the front surface connection electrode, the rear surface connection electrode, and the bonding layer therebetween may be formed wider than the pitch of the through electrode, the gap between the bonding structures may be increased. As a result, it is possible to reduce or prevent the formation of voids in the gap-fill material 810 or the molding layer 820 between the bonding structures and procedural defects resulting from the formation of voids.

Meanwhile, the above embodiments of the present disclosure describe the case where the front surface connection electrode and the rear surface connection electrode of the stacked semiconductor chip are bonded to each other by using the bonding layer. However, the present disclosure is not limited thereto, and the front surface connection electrode and the rear surface connection electrode of the stacked semiconductor chip may be directly bonded. This will be described below with reference to FIG. 9.

Figure 9:
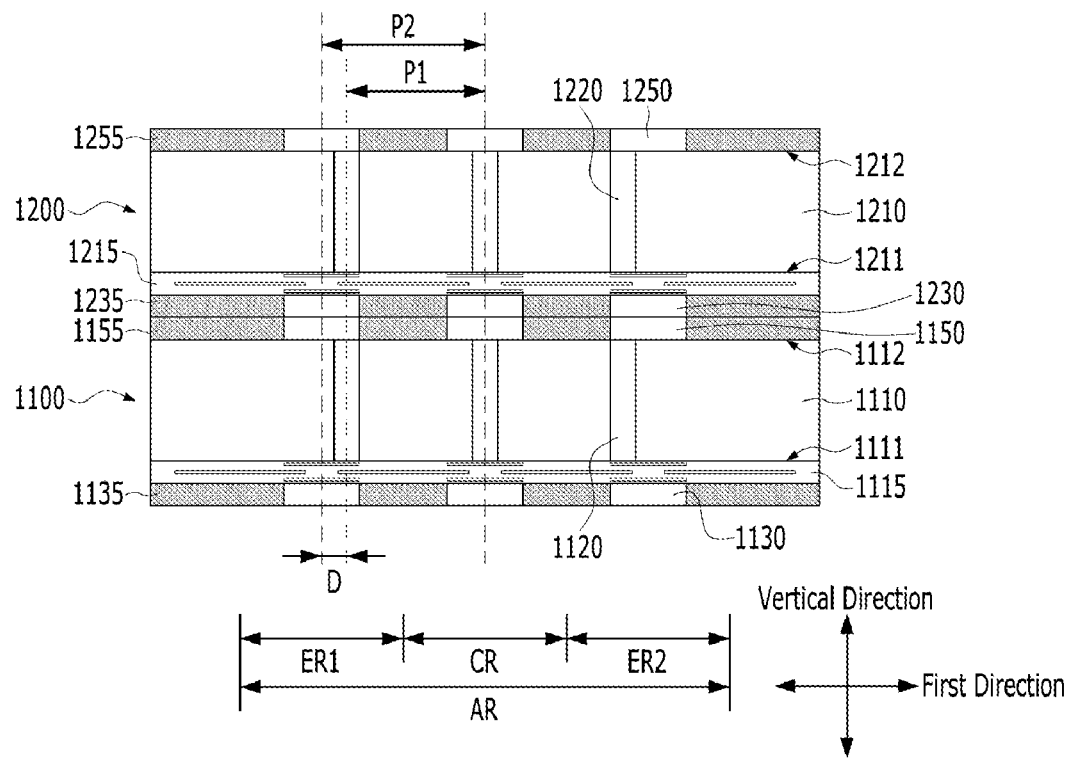
FIG. 9 is a cross-sectional view illustrating stacked semiconductor chips in accordance with another embodiment of the present disclosure.

FIG. 9 is a cross-sectional view illustrating a stacked semiconductor chip in accordance with another embodiment of the present disclosure.

Referring to FIG. 9, a second semiconductor chip 1200 may be stacked over the first semiconductor chip 1100.

The first semiconductor chip 1100 may include a first body part 1110 having a front surface 1111 and a rear surface 1112, a first wiring part 1115 over the front surface 1111 of the first body part 1110, a first through electrode 1120 penetrating through the first body part 1110, a first front surface connection electrode 1130 coupled to the first through electrode 1120 through the first wiring part 1115 over the first wiring part 1115, a first front surface dielectric layer 1135 filling the space between the first front surface connection electrodes 1130 over the first wiring part 1115, a first rear surface connection electrode 1150 coupled to the first through electrode 1120 over the rear surface 1112 of the first body part 1110, and a first rear surface dielectric layer 1155 filling the space between the first rear surface connection electrodes 1150 over the rear surface 1112 of the first body part 1110.

The second semiconductor chip 1200 may include a second body part 1210 having a front surface 1211 and a rear surface 1212, a second wiring part 1215 over the front surface 1211 of the second body part 1210, a second through electrode 1220 penetrating the second body part 1210, a second front surface connection electrode 1230 coupled to the second through electrode 1220 through the second wiring part 1215 over the second wiring part 1215, a second front surface dielectric layer 1235 filling the space between the second front surface connection electrodes 1230 over the second wiring part 1215, a second rear surface connection electrode 1250 coupled to the second through electrode 1220 over the rear surface 1212 of the second body part 1210, and a second rear surface dielectric layer 1255 filling the space between the second rear surface connection electrodes 1250 over the rear surface 1212 of the second body part 1210.

The arrangement and width of the first through electrode 1120 and the second through electrode 1220 may be substantially the same. In particular, the centers of the first through electrode 1120 and the second through electrode 1220 may coincide with each other, and a plurality of the first through electrodes 1120 and a plurality of the second through electrodes 1220 may be in arranged to have the first pitch P1 in the first direction.

The arrangement and width of the first front surface connection electrode 1130, the first rear surface connection electrode 1150, the second front surface connection electrode 1230, and the second rear surface connection electrode 1250 may be substantially the same. In particular, the centers of the first front surface connection electrode 1130, the first rear surface connection electrode 1150, the second front surface connection electrode 1230, and the second rear surface connection electrode 1250 may coincide with each other, and a plurality of the first front surface connection electrodes 1130, a plurality of the first rear surface connection electrodes 1150, a plurality of the second front surface connection electrodes 1230, and a plurality of the second rear surface connection electrodes 1250 may be arranged to have the second pitch P2 in the first direction.

Here, in the central region CR, the centers of the first front surface connection electrode 1130, the first rear surface connection electrode 1150, the second front surface connection electrode 1230, and the second rear surface connection electrode 1250 may coincide with the centers of the first and second through electrodes 1120 and 1220. On the other hand, in the one-side edge region ER1, the centers of the first front surface connection electrode 1130, the first rear surface connection electrode 1150, the second front surface connection electrode 1230, and the second rear surface connection electrode 1250 may be positioned at a distance farther from the central region CR than the centers of the first and second through electrodes 1120 and 1220, e.g., on the left side. Also, in the other-side edge region ER2, the first front surface connection electrode 1130, the first rear surface connection electrode 1150, the second front surface connection electrode 1230, and the second rear surface connection electrode 1250 may be positioned at a distance farther from the central region CR than the centers of the first and second through electrodes 1120 and 1220, e.g., on the right side. Accordingly, the second pitch P2 may be greater than the first pitch P1. In each of the one-side edge region ER1 and the other-side edge region ER2, the distance between the centers of the first front surface connection electrode 1130, the first rear surface connection electrode 1150, the second front surface connection electrode 1230, and the second rear surface connection electrode 1250 and the centers of the first and second through electrodes 1120 and 1220 is denoted by a reference symbol D.

The second semiconductor chip 1200 may be stacked over the first semiconductor chip 1100 with the front surface 1211 facing the rear surface 1112 of the first semiconductor chip 1100. Here, the first rear surface connection electrode 1150 may be directly bonded to the second front surface connection electrode 1230, and the first rear surface dielectric layer 1155 may be directly bonded to the second front surface dielectric layer 1235. The first rear surface connection electrode 1150 and the second front surface connection electrode 1230 may be bonded by inter-diffusion of metals forming them, such as copper. Also, the first rear surface dielectric layer 1155 and the second front surface dielectric layer 1235 may be bonded by a covalent bonding which is formed between the dielectric materials forming them, for example, silicon oxide or silicon nitride. Accordingly, hybrid bonding between the first semiconductor chip 1100 and the second semiconductor chip 1200, that is, bonding of a metal and a metal, and a dielectric layer and a dielectric layer, may be performed in-situ.

According to an embodiment of the present disclosure, a semiconductor chip including a through electrode which may be reduced in size while reducing processing defects, and a semiconductor package including the semiconductor chips are provided.

Figure 10:
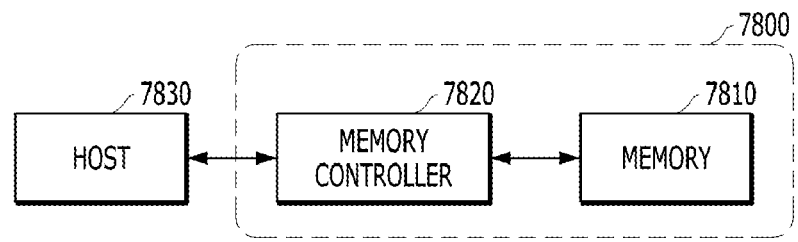
FIG. 10 shows a block diagram illustrating an electronic system employing a memory card including a semiconductor package, according to an embodiment.

FIG. 10 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
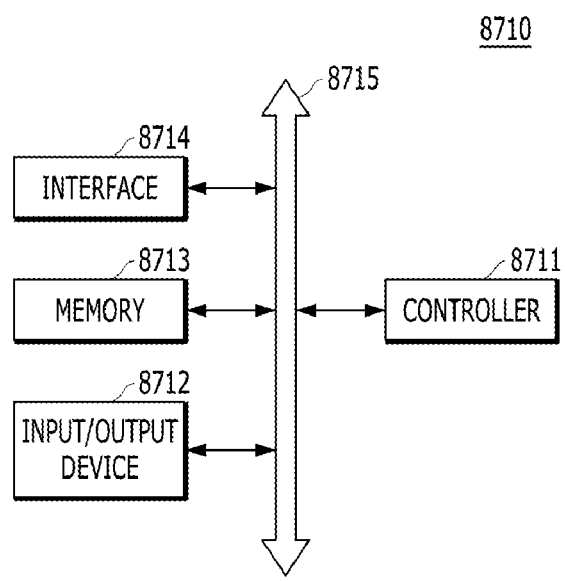
FIG. 11 shows a block diagram illustrating another electronic system including a semiconductor package, according to an embodiment.

FIG. 11 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

While the present disclosure has been described with respect to a limited number of specific embodiments, it will be apparent to those skilled in the art that various changes and modifications may be made these embodiments without departing from the spirit and scope of the disclosure as defined in the following claims.

What is claimed is:

1. A semiconductor chip, comprising:
a body part having a front surface, a rear surface, and an array region;
a plurality of through electrodes penetrating the body part in the array region from the front surface to the rear surface, wherein the plurality of through electrodes are arranged in a first direction perpendicular to a direction in which the plurality of through electrodes penetrate the body part;
a plurality of front surface connection electrodes coupled in a one-to-one manner to the plurality of through electrodes over the front surface of the body part; and
a plurality of rear surface connection electrodes coupled in a one-to-one manner to the plurality of through electrodes over the rear surface of the body part,
wherein the array region includes a central region, a first edge region positioned on a first side of the central region in the first direction, and a second edge region positioned on a second side of the central region opposite the first side in the first direction,
wherein a center of a first front surface connection electrode of the plurality of front surface connection electrodes and a center of a first rear surface connection electrode of the plurality of rear surface connection electrodes that are coupled to a first through electrode of the plurality of through electrodes positioned in the first edge region are positioned at a distance farther from the central region than a center of the first through electrode, and
wherein a center of a second front surface connection electrode of the plurality of front surface connection electrodes and a center of a second rear surface connection electrode of the plurality of rear surface connection electrodes that are coupled to a second through electrode of the plurality of through electrodes positioned in the second edge region are positioned at a distance farther from the central region than a center of the second through electrode.

2. The semiconductor chip of claim 1, wherein a center of a third front surface connection electrode of the plurality of front surface connection electrodes and a center of a third rear surface connection electrode of the plurality of rear surface connection electrodes coincide with a center of a third through electrode of the plurality of through electrodes to which the third front surface connection electrode and the third rear surface connection electrode are coupled, wherein the third front surface connection electrode, the third rear surface connection electrode, and the third through electrode are positioned in the central region.

3. The semiconductor chip of claim 1, wherein:
the plurality of through electrodes are arranged to have a first pitch in the first direction,
the plurality of front surface connection electrodes are arranged to have a second pitch in the first direction,
the plurality of rear surface connection electrodes are arranged to have the second pitch in the first direction, and
the second pitch is greater than the first pitch.

4. The semiconductor chip of claim 1, wherein:
the array region includes first to $N^{th}$ edge regions positioned on the first side of the central region that are sequentially arranged according to a distance from the central region (where N is a natural number of 2 or more and sequentially arranged according to a distance from the central region means that each sequential edge region is a greater distance from the central region than a previous edge region such that the $N^{th}$ edge region is a greater distance from the central region that the $(N-1)^{th}$ edge region), the array region includes first to $N^{th}$ edge regions positioned on the second side of the central region that are sequentially arranged according to a distance from the central region, and for both the first side and the second side of the central region, a distance between centers of both the kth front surface connection electrode of the plurality of front surface connection electrodes and the $k^{th}$ rear surface connection electrode of the plurality of rear surface connection electrodes and a center of the $k^{th}$ through electrode of the plurality of through electrodes to which the $k^{th}$ front surface connection electrode and the $k^{th}$ rear surface connection electrode are coupled is smaller than a distance between centers of both the $(k+1)^{th}$ front surface connection electrode of the plurality of front surface connection electrodes and the $(k+1)^{th}$ rear surface connection electrode of the plurality of rear surface connection electrodes and a center of the $(k+1)^{th}$ through electrode of the plurality of through electrodes to which the $(k+1)^{th}$ front surface connection electrode and the $(k+1)^{th}$ rear surface connection electrode are coupled (where k represents natural numbers from 1 to N−1).

5. A semiconductor chip, comprising:
a body part having a front surface, a rear surface opposite the front surface, a first array region, and a second array region adjacent to the first array region in a first direction perpendicular to a normal direction for the front and rear surfaces;
a first plurality of through electrodes penetrating the body part in the first array region from the front surface to the rear surface, wherein the first plurality of through electrodes are arranged in the first direction;
a first plurality of front surface connection electrodes in the first array region coupled in a one-to-one manner to the first plurality of through electrodes over the front surface of the body part;
a first plurality of rear surface connection electrodes in the first array region coupled in a one-to-one manner to the first plurality of through electrodes over the rear surface of the body part;
a second plurality of through electrodes penetrating the body part in the second array region from the front surface to the rear surface, wherein the second plurality of through electrodes are arranged in the first direction;
a second plurality of front surface connection electrodes in the second array region coupled in a one-to-one manner to the second plurality of through electrodes over the front surface of the body part; and
a second plurality of rear surface connection electrodes in the second array region coupled in a one-to-one manner to the second plurality of through electrodes over the rear surface of the body part,
wherein the first array region includes a first central region, a first edge region positioned on a first side of the first central region in the first direction, and a second edge region positioned on a second side of the central region opposite the first side in the first direction,
wherein the second array region includes a second central region, a third edge region positioned on the first side of the second central region in the first direction, and a fourth edge region positioned on the second side of the second central region opposite the first side in the first direction,
wherein a center of a first front surface connection electrode of the first plurality of front surface connection electrodes and a center of a first rear surface connection electrode of the first plurality of rear surface connection electrodes that are coupled to a first through electrode of the first plurality of through electrodes positioned in the first edge region are positioned at a distance farther from the first central region than a center of the first through electrode, wherein a center of a second front surface connection electrode of the first plurality of front surface connection electrodes and a center of a second rear surface connection electrode of the first plurality of rear surface connection electrodes that are coupled to a second through electrode of the first plurality of through electrodes positioned in the second edge region are positioned at a distance farther from the first central region than a center of the second through electrode, wherein a center of a third front surface connection electrode of the second plurality of front surface connection electrodes and a center of a third rear surface connection electrode of the second plurality of rear surface connection electrodes that are coupled to a third through electrode of the second plurality of through electrodes positioned in the third edge region are positioned at a distance farther from the second central region than a center of the third through electrode, and wherein a center of a fourth front surface connection electrode of the second plurality of front surface connection electrodes and a center of a fourth rear surface connection electrode of the second plurality of rear surface connection electrodes that are coupled to a fourth through electrode of the second plurality of through electrodes positioned in the fourth edge region are positioned at a distance farther from the second central region than a center of the fourth through electrode.

6. The semiconductor chip of claim 5, wherein:
the first plurality of through electrodes are arranged to have a first pitch in the first direction,
the second plurality of through electrodes are arranged to have the first pitch in the first direction,
the first plurality of front surface connection electrodes are arranged to have a second pitch in the first direction,
the first plurality of rear surface connection electrodes are arranged to have the second pitch in the first direction,
the second plurality of front surface connection electrodes are arranged to have the second pitch in the first direction,
the second plurality of rear surface connection electrodes are arranged to have the second pitch in the first direction, and
the second pitch is greater than the first pitch.

7. The semiconductor chip of claim 6, wherein:
the second edge region of the first array region and the third edge region of the second array region are adjacent to each other in the first direction, and
a distance between the center of the second through electrode of the second edge region of the first array region and the center of the fourth through electrode of the third edge region of the second array region is greater than the first pitch.

8. The semiconductor chip of claim 7, wherein a distance between the centers of the second front surface connection electrode and the second rear surface connection electrode of the second edge region of the first array region and the centers of the third front surface connection electrode and the third rear surface connection electrode of the third edge region of the second array region is the same as the second pitch.

9. The semiconductor chip of claim 5, wherein:
   a center of a fifth through electrode of the first plurality of through electrodes positioned in the first central region coincides with a center of a fifth front surface connection electrode of the first plurality of front surface connection electrodes positioned in the first central region and coupled to the fifth through electrode and a center of a fifth rear surface connection electrode of the first plurality of rear surface connection electrodes positioned in the first central region and coupled to the fifth through electrode, and
   a center of a sixth through electrode of the second plurality of through electrodes positioned in the second central region coincides with a center of a sixth front surface connection electrode of the second plurality of front surface connection electrodes positioned in the second central region and coupled to the sixth through electrode and a center of a sixth rear surface connection electrode of the second plurality of rear surface connection electrodes positioned in the second central region and coupled to the sixth through electrode.

10. The semiconductor chip of claim 5, wherein:
   the first array region includes first to $N^{th}$ edge regions positioned on the first side of the first central region that are sequentially arranged according to a distance from the first central region (where N is a natural number of 2 or more and sequentially arranged according to a distance from a central region means that each sequential edge region is a greater distance from the central region than a previous edge region such that the $N^{th}$ edge region is a greater distance from the central region that the $(N-1)^{th}$ edge region),
   the first array region includes first to $N^{th}$ edge regions positioned on the second side of the first central region that are sequentially arranged according to a distance from the first central region,
   the second array region includes first to $N^{th}$ edge regions positioned on the first side of the second central region that are sequentially arranged according to a distance from the second central region,
   the second array region includes first to $N^{th}$ edge regions positioned on the second side of the second central region that are sequentially arranged according to a distance from the second central region,
   for both the first side and the second side of the first central region, a distance between centers of both the kth front surface connection electrode of the first plurality of front surface connection electrodes and the $k^{th}$ rear surface connection electrode of the first plurality of rear surface connection electrodes and a center of the $k^{th}$ through electrode of the first plurality of through electrodes to which the $k^{th}$ front surface connection electrode and the $k^{th}$ rear surface connection electrode are coupled is smaller than a distance between centers of both the $(k+1)^{th}$ front surface connection electrode of the first plurality of front surface connection electrodes and the $(k+1)^{th}$ rear surface connection electrode of the first plurality of rear surface connection electrodes and a center of the $(k+1)^{th}$ through electrode of the first plurality of through electrodes to which the $(k+1)^{th}$ front surface connection electrode and the $(k+1)^{th}$ rear surface connection electrode are coupled (where k represents natural numbers from 1 to N-1, and for both the first side and the second side of the second central region, a distance between centers of both the kth front surface connection electrode of the second plurality of front surface connection electrodes and the $k^{th}$ rear surface connection electrode of the second plurality of rear surface connection electrodes and a center of the $k^{th}$ through electrode of the second plurality of through electrodes to which the $k^{th}$ front surface connection electrode and the $k^{th}$ rear surface connection electrode are coupled is smaller than a distance between centers of both the $(k+1)^{th}$ front surface connection electrode of the second plurality of front surface connection electrodes and the $(k+1)^{th}$ rear surface connection electrode of the second plurality of rear surface connection electrodes and a center of the $(k+1)^{th}$ through electrode of the second plurality of through electrodes to which the $(k+1)^{th}$ front surface connection electrode and the $(k+1)^{th}$ rear surface connection electrode are coupled.

11. A semiconductor package, comprising:
   a first semiconductor chip including a first body part having a front surface and a rear surface, a plurality of first through electrodes penetrating through the first body part, wherein the plurality of first through electrodes are arranged in a first direction perpendicular to a direction in which the plurality of first through electrodes penetrate through the first body part;
   a plurality of first rear surface connection electrodes coupled in a one-to-one manner to the first through electrodes of the plurality of first through electrodes over the rear surface of the first body part; and
   a second semiconductor chip including a second body part having a front surface and a rear surface, and a plurality of second front surface connection electrodes that are positioned over the front surface of the second body part,
   wherein the first rear surface connection electrodes of the plurality of rear surface connection electrodes and the second front surface connection electrodes of the plurality of second front surface connection electrodes are coupled in a one-to-one manner to each other,
   wherein an array region for the first and second semiconductor chips includes a central region, a first edge region positioned on a first side of the central region in the first direction, and a second edge region positioned on a second side of the central region opposite the first side in the first direction,
   wherein a center of the first second front surface connection electrode of the plurality of second front surface connection electrodes and a center of the first first rear surface connection electrode of the plurality of first rear surface connection electrodes positioned the first edge region is positioned at a distance farther from the central region than a center of a first first through electrode of the plurality of first through electrodes coupled to the first second front surface connection electrode and coupled to the first first rear surface connection electrode, and
   wherein a center of the second second front surface connection electrode of the plurality of second front surface connection electrodes and a center of the second first rear surface connection electrode of the plurality of first rear surface connection electrodes positioned the second edge region is positioned at a distance farther from the central region than a center of the second first through electrode of the plurality of first through electrodes coupled to the second second front surface connection electrode and coupled to the second first rear surface connection electrode.

12. The semiconductor package of claim 11, wherein a center of a third second front surface connection electrode of the plurality of second front surface connection electrodes and a center of a third first rear surface connection electrode of the plurality of first rear surface connection electrodes coincide with the center of a third first through electrode of the plurality of first through electrodes to which the third second front surface connection electrode and the third first rear surface connection electrode are coupled, wherein the third second front surface connection electrode, the third first rear surface connection electrode, and the third first through electrode are positioned in the central region.

13. The semiconductor package of claim 11, wherein:
the plurality of first through electrodes are arranged to have a first pitch in the first direction,
the plurality of second front surface connection electrodes are arranged to have a second pitch in the first direction,
the plurality of first rear surface connection electrodes are arranged to have the second pitch in the first direction, and
the second pitch is greater than the first pitch.

14. The semiconductor package of claim 11, wherein:
the array region includes first to $N^{th}$ edge regions positioned on the first side of the central region that are sequentially arranged according to a distance from the central region (where N is a natural number of 2 or more and sequentially arranged according to a distance from the central region means that each sequential edge region is a greater distance from the central region than a previous edge region such that the $N^{th}$ edge region is a greater distance from the central region that the $(N-1)^{th}$ edge region),
the array region includes first to $N^{th}$ edge regions positioned on the second side of the central region that are sequentially arranged according to a distance from the central region, and
for both the first side and the second side of the central region, a distance between centers of both the kth second front surface connection electrode of the plurality of second front surface connection electrodes and the $k^{th}$ first rear surface connection electrode of the plurality of first rear surface connection electrodes and a center of the $k^{th}$ first through electrode of the plurality of first through electrodes to which the $k^{th}$ second front surface connection electrode and the $k^{th}$ first rear surface connection electrode are coupled is smaller than a distance between centers of both the $(k+1)^{th}$ second front surface connection electrode of the plurality of second front surface connection electrodes and the $(k+1)^{th}$ first rear surface connection electrode of the plurality of first rear surface connection electrodes and a center of the $(k+1)^{th}$ first through electrode of the plurality of first through electrodes to which the $(k+1)^{th}$ second front surface connection electrode and the $(k+1)^{th}$ first rear surface connection electrode are coupled (where k represents natural numbers from 1 to N−1).

15. The semiconductor package of claim 11, further comprising a gap-fill material or a molding material filling a space between the first semiconductor chip and the second semiconductor chip.

16. The semiconductor package of claim 11, further comprising a bonding layer suitable for bonding the plurality of first rear surface connection electrodes and the plurality of second front surface connection electrodes to each other.

17. The semiconductor package of claim 11, wherein the plurality of first rear surface connection electrodes and the plurality of second front surface connection electrodes are directly bonded.

18. The semiconductor package of claim 17, wherein:
the first semiconductor chip further includes a first rear surface dielectric layer filling a space between the plurality of first rear surface connection electrodes,
the second semiconductor chip further includes a second front surface dielectric layer filling a space between the plurality of second front surface connection electrodes, and
the first rear surface dielectric layer and the second front surface dielectric layer are directly bonded.

19. The semiconductor package of claim 11, wherein, in the first direction, a width of each of the plurality of first through electrodes is smaller than both a width of each of the plurality of second front surface connection electrodes and a width of each of the plurality of first rear surface connection electrodes.

20. The semiconductor package of claim 11, wherein each of the plurality of first rear surface connection electrodes entirely and in a one-to-one manner overlaps an end of each of the plurality of first through electrodes.

* * * * *